United States Patent
Zeng et al.

(10) Patent No.: US 11,144,142 B2
(45) Date of Patent: Oct. 12, 2021

(54) FLEXIBLE TOUCH SCREEN, MANUFACTURING METHOD THEREOF AND DISPLAY DEVICE

(71) Applicants: Hefei Xinsheng Optoelectronics Technology Group Co., Ltd., Hefei (CN); BOE Technology Group Co., Ltd., Beijing (CN)

(72) Inventors: Ting Zeng, Beijing (CN); Yuan Li, Beijing (CN); Qicheng Chen, Beijing (CN); Yangjie Li, Beijing (CN); Liuyue Yin, Beijing (CN); Binghong Wang, Beijing (CN)

(73) Assignees: Hefei Xinsheng Optoelectronics Technology Group Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 17 days.

(21) Appl. No.: 16/390,216

(22) Filed: Apr. 22, 2019

(65) Prior Publication Data
US 2020/0026381 A1    Jan. 23, 2020

(30) Foreign Application Priority Data
Jul. 20, 2018    (CN) .......................... 201810803180.5

(51) Int. Cl.
    *G06F 3/00*    (2006.01)
    *H01L 51/00*    (2006.01)
    (Continued)

(52) U.S. Cl.
    CPC ............ *G06F 3/0412* (2013.01); *G06F 3/044* (2013.01); *H01L 51/0097* (2013.01);
    (Continued)

(58) Field of Classification Search
    USPC .................................................. 156/247, 249
    See application file for complete search history.

(56) References Cited

U.S. PATENT DOCUMENTS

| 7,936,338 B2 * | 5/2011 | Iwase .................... G06F 3/0418 345/173 |
| 2014/0285733 A1 * | 9/2014 | Chi ..................... G02F 1/13338 349/12 |

(Continued)

FOREIGN PATENT DOCUMENTS

| CN | 102729549 A | 10/2012 |
| CN | 105632347 A | 6/2016 |

(Continued)

OTHER PUBLICATIONS

English translation of Chinese Office action for corresponding application 201810803180.5 dated Dec. 3, 2020, 13 pages (Year: 2020).*

(Continued)

*Primary Examiner* — Linda L Gray
(74) *Attorney, Agent, or Firm* — Arent Fox LLP; Michael Fainberg

(57) ABSTRACT

A flexible touch screen, a manufacturing method thereof and a display device are provided. The manufacturing method includes: attaching a first protecting layer to a surface of a flexible substrate; attaching a surface of the flexible substrate away from the first protecting layer to a base substrate; removing the first protecting layer; forming a touch electrode layer on a side of the flexible substrate away from the base substrate; attaching a second protecting layer to the surface of the touch electrode layer; separating the flexible substrate from the base substrate; and removing the second protecting layer.

8 Claims, 5 Drawing Sheets

(51) Int. Cl.
  *H01L 27/00* (2006.01)
  *G06F 3/041* (2006.01)
  *G06F 3/044* (2006.01)
  *H01L 27/12* (2006.01)

(52) U.S. Cl.
  CPC ............ *G06F 2203/04102* (2013.01); *G06F 2203/04103* (2013.01); *H01L 27/1266* (2013.01); *H01L 51/003* (2013.01); *H01L 2251/5338* (2013.01)

(56) References Cited

U.S. PATENT DOCUMENTS

| | | | |
|---|---|---|---|
| 2014/0367644 A1* | 12/2014 | Song | H01L 51/5256 257/40 |
| 2015/0185911 A1* | 7/2015 | Kim | H03K 17/975 349/12 |
| 2015/0216057 A1* | 7/2015 | Park | H05K 3/207 174/255 |
| 2016/0035801 A1* | 2/2016 | Kim | H01L 51/5253 257/40 |
| 2018/0053790 A1* | 2/2018 | Kwon | H01L 27/1222 |
| 2018/0129317 A1* | 5/2018 | Ryu | B32B 7/12 |
| 2018/0212167 A1* | 7/2018 | Chun | G02F 1/133305 |
| 2019/0004642 A1* | 1/2019 | Chen | H01L 51/003 |
| 2019/0165327 A1* | 5/2019 | Ye | H01L 27/3244 |
| 2019/0361586 A1* | 11/2019 | Weng | G06F 3/0416 |

FOREIGN PATENT DOCUMENTS

| | | |
|---|---|---|
| CN | 106155431 A | 11/2016 |
| CN | 106373917 A | 2/2017 |
| CN | 106935547 A | 7/2017 |
| CN | 107357454 A | 11/2017 |
| CN | 108287622 A | 7/2018 |
| NA | 20c7008583 U | 2/2018 |

OTHER PUBLICATIONS

Chinese Office Action for corresponding application 201810803180.5 dated Dec. 3, 2020, 9 pages.
Chinese Office Action for corresponding application 201810803180.5 dated Apr. 14, 2021.

* cited by examiner

FLEXIBLE TOUCH SCREEN, MANUFACTURING METHOD THEREOF AND DISPLAY DEVICE

CROSS-REFERENCES TO RELATED APPLICATIONS

This application claims priority to Chinese patent application No. 201810803180.5 filed on Jul. 20, 2018, which is incorporated herein by reference in its entirety.

FIELD

The present disclosure relates to the technical field of touch display, in particular to a flexible touch screen, a manufacturing method thereof and a display device.

BACKGROUND

With rapid development of a display technology, an organic light-emitting diode (OLED) display gradually becomes the hotspot of current electronic display, and the principle of the OLED display is a self-luminous technology, namely, electronic energy level transition luminescence is implemented by electron-hole filling. The OLED display was first used on a mobile phone product, and lots of top-grade mobile phone products in the markets at present use OLED displays, such as S6/S7/S8 models of Samsung mobile phones and the R9 model of OPPO mobile phones. In addition, flexible touch screens which are developed along with the development of the OLED displays have been gradually popularized in the field of OLED display.

SUMMARY

In one aspect, the embodiment of the present disclosure provides a manufacturing method of the flexible touch screen. The manufacturing method includes: attaching a first protecting layer to a surface of a flexible substrate; attaching a surface of the flexible substrate away from the first protecting layer to a base substrate; removing the first protecting layer; forming a touch electrode layer on a side of the flexible substrate away from the base substrate; attaching a second protecting layer to a surface of the touch electrode layer; separating the flexible substrate from the base substrate; and removing the second protecting layer.

In a possible implementation, in the manufacturing method according to the embodiment of the present disclosure, a difference between a coefficient of thermal expansion of the first protecting layer and a coefficient of thermal expansion of the flexible substrate is smaller than 0.05%; and a difference between a coefficient of thermal expansion of the second protecting layer and the coefficient of thermal expansion of the flexible substrate is smaller than 0.05%.

In a possible implementation, in the manufacturing method according to the embodiment of the present disclosure, a material of the first protecting layer is phenolic resin, polyethylene terephthalate or cyclo olefin polymer; and a material of the second protecting layer is phenolic resin, polyethylene terephthalate or cyclo olefin polymer.

In a possible implementation, in the manufacturing method according to the embodiment of the present disclosure, attaching the surface of the flexible substrate away from the first protecting layer to the base substrate includes: forming a temperature-controlled bonding layer on the base substrate; and attaching the flexible substrate to the base substrate through the temperature-controlled bonding layer.

In a possible implementation, in the manufacturing method according to the embodiment of the present disclosure, removing the second protecting layer includes: after dividing the flexible substrate on which the touch electrode layer is formed, removing the second protecting layer.

In a possible implementation, in the manufacturing method according to the embodiment of the present disclosure, before attaching the first protecting layer to the surface of the flexible substrate, the method further includes: forming a hardened layer on each of two surfaces of the flexible substrate.

In a possible implementation, in the manufacturing method according to the embodiment of the present disclosure, attaching the first protecting layer to the surface of the flexible substrate includes: forming an index matching layer on any one surface of the flexible substrate; and attaching the first protecting layer to the index matching layer.

In a possible implementation, in the manufacturing method according to the embodiment of the present disclosure, forming the touch electrode layer on the side of the flexible substrate away from the base substrate includes: forming a plurality of first touch electrodes and a plurality of second touch electrodes on the side of the flexible substrate away from the base substrate; wherein the first touch electrodes and the second touch electrodes are intersected with each other, each first touch electrode has a strip-shaped structure, and each second touch electrode includes a plurality of sub-electrodes; forming a plurality of signal lines; wherein the signal lines are connected with the first touch electrodes or the second touch electrodes; forming an insulating layer on a layer where the signal lines are located; and forming a plurality of bridging lines on the insulating layer; wherein the bridging lines are configured to connect the sub-electrodes in the second touch electrodes.

In a possible implementation, in the manufacturing method according to the embodiment of the present disclosure, the material of the first protecting layer is the same as the material of the second protecting layer.

In a possible implementation, in the manufacturing method according to the embodiment of the present disclosure, the material of the first protecting layer and the material of the second protecting layer are the same as the material of the flexible substrate.

In a possible implementation, in the manufacturing method according to the embodiment of the present disclosure, a material of the temperature-controlled bonding layer is an optically clear adhesive material.

In another aspect, the embodiment of the present disclosure provides a flexible touch screen, and the flexible touch screen is manufactured by the manufacturing method above.

In another aspect, the embodiment of the present disclosure provides a display which includes the flexible touch screen above.

DETAILED DESCRIPTION OF THE EMBODIMENTS

In the related art, due to influences of factors such as the yield of products, Moire pattern phenomenon and transmittance, touch electrodes made of metal materials have lots of shortcomings, but touch electrodes made of transparent conductive oxides are relatively good in conductivity and transmittance, for example, the touch electrode can be made of indium tin oxide (ITO), and the flexible touch screen made of the transparent conductive material may occupy the market share of OLED displays for a long time. With the rapid development of full-screen mobile phones, flexible touch screens are required to have narrow bezel and are even required to have no bezel, and thus the touch electrodes are required to have low sheet resistance so as to make driving chips (IC) to have driving ability; and moreover, in order to reduce power consumption of the OLED displays on touch screens, the touch electrodes are also required to be developed towards the direction of low sheet resistance value.

However, if the touch electrodes of the flexible touch screens are required to have low sheet resistance, then the thicknesses of transparent conductive oxide films which are used for manufacturing the touch electrodes are required to be increased, the pressure stress of the transparent conductive oxide films can be increased along with increasing of the thicknesses of the transparent conductive oxide films, moreover flexible substrate is relatively thin generally, after being manufactured, the flexible touch screens are easy to curl when torn off from base substrate, and therefore, the yield of the flexible touch screens is affected.

For solving the problem that a flexible touch screen in the related art is easy to curl in a manufacturing process, an embodiment of the present disclosure provides a flexible touch screen, a manufacturing method thereof and a display device.

Specific implementations of the flexible touch screen, the manufacturing method thereof and the display device which are provided by the embodiment of the present disclosure will be described in detail hereinafter in conjunction with the accompanying drawings. The thicknesses and shapes of various film layers in the accompanying drawings do not reflect true scale, but only aim to illustrate and describe contents of the present disclosure.

Figure 1:
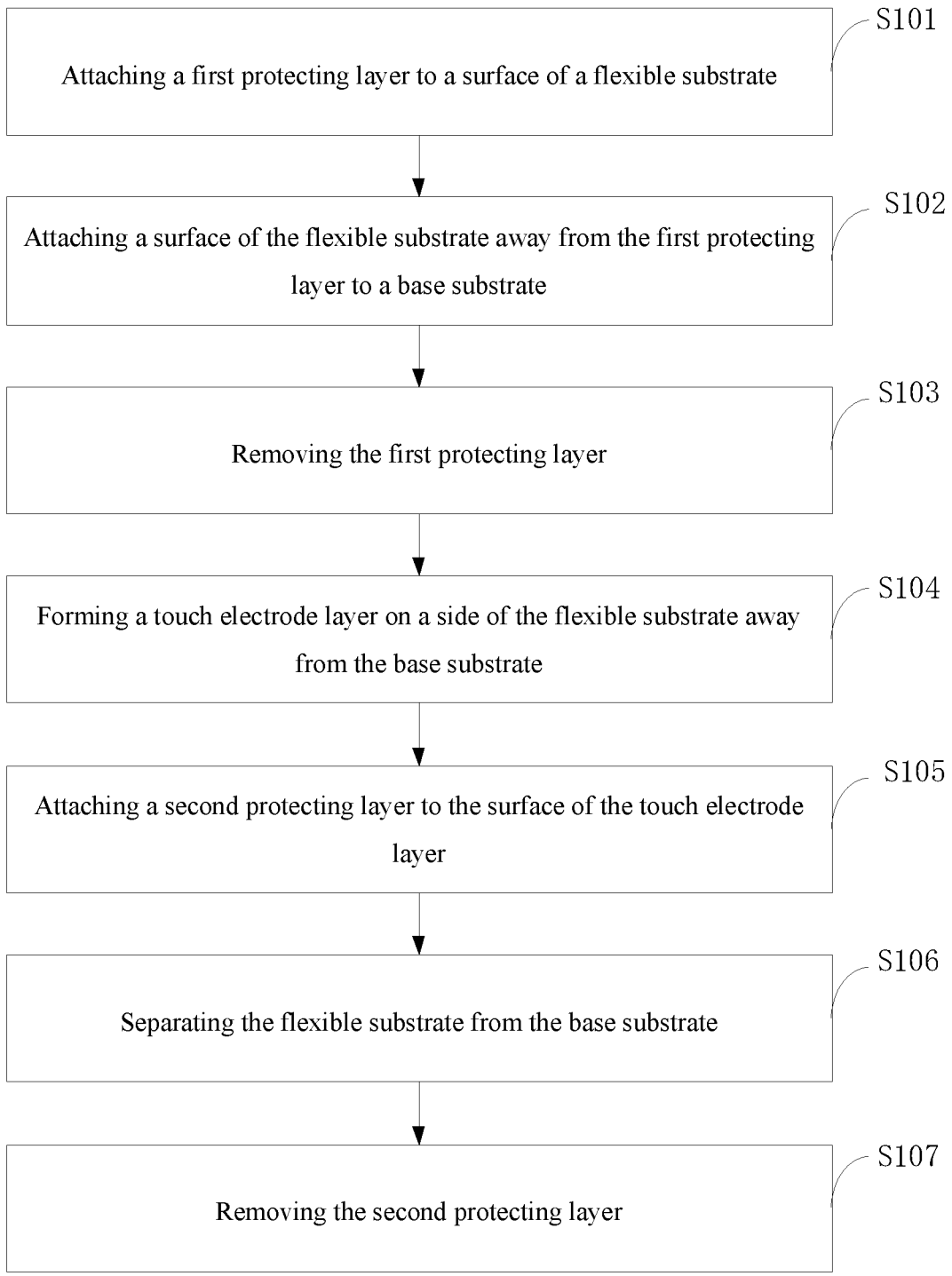
FIG. 1 is a flow chart of a manufacturing method of a flexible touch screen according to an embodiment of the present disclosure.

In one aspect, the embodiment of the present disclosure provides a manufacturing method of the flexible touch screen, and as shown in FIG. 1, the manufacturing method includes the following steps.

Figure 2A:
FIG. 2A to FIG. 2G are schematic diagrams of various structures corresponding to the manufacturing method according to the embodiment of the present disclosure.

In the S101, a first protecting layer 102 is attached to the surface of a flexible substrate 101, as shown in FIG. 2A.

Figure 2B:
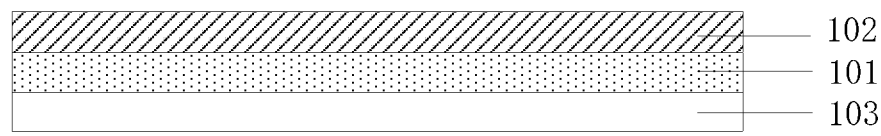

In the S102, the surface of the flexible substrate 101 facing away from the first protecting layer 120 is attached to a base substrate 103, as shown in FIG. 2B.

Figure 2C:
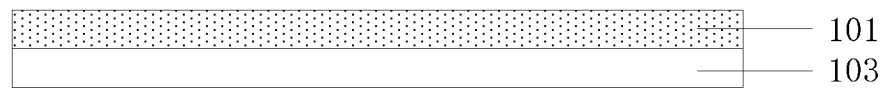

In the S103, the first protecting layer is removed, resulting in a structure as shown in FIG. 2C.

Figure 2D:

In the S104, a touch electrode layer 104 is formed on the side of the flexible substrate 101 facing away from the base substrate 103, as shown in FIG. 2D.

Figure 2E:

In the S105, a second protecting layer 105 is attached to the surface of the touch electrode layer 104, as shown in FIG. 2E.

Figure 2F:
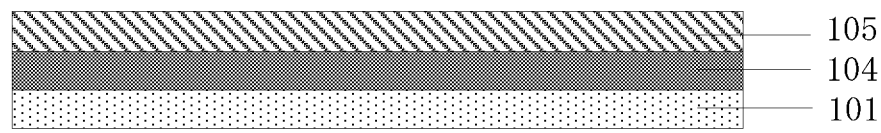

In the S106, the flexible substrate 101 is separated from the base substrate, to obtain a structure as shown in FIG. 2F.

Figure 2G:

In the S107, the second protecting layer is removed, resulting in a structure as shown in FIG. 2G.

According to the manufacturing method of the flexible touch screen provided by the embodiment of the present disclosure, before the flexible substrate is attached to the base substrate, the first protecting layer is attached to the surface of the flexible substrate, the first protecting layer has a supporting effect, then the flexible substrate can be flatly attached to the base substrate, after the flexible substrate is attached to the base substrate, the first protecting layer is removed, the structure of the flexible touch screen cannot be affected. Moreover, the second protecting layer is attached to the flexible substrate after the touch electrode layer is manufactured, therefore the flexible substrate may not curl when separated from the base substrate, and the yield of products is improved.

The manufacturing method of the flexible touch screen provided by the embodiment of the present disclosure is mainly used for manufacturing an external touch screen, in other words, after being manufactured, the flexible touch screen can be attached to a display panel to realize touch display, for example, the flexible touch screen can be attached to a light exiting surface of an OLED display panel to implement flexible touch display. Moreover, the flexible touch screen can also be applied to other display panels such as a liquid crystal display panel, and the application scenarios of the foregoing manufacturing method are not limited here.

In practical application, a touch electrode is manufactured from a transparent conductive material optionally, for example, the touch electrode can be manufactured from an ITO material, and can also be manufactured from another transparent conductive material, the material of the touch electrode is not limited here, and in the embodiment of the present disclosure, ITO is taken as an example for illustration.

In the related art, the sheet resistance of the most commonly used ITO is $100\Omega/\square$, a touch electrode layer can be manufactured by a roll-to-roll coating process, and because of influences of limitation of coating equipment and cracks and the like which are easily caused during rolling after coating, the minimum sheet resistance of ITO which can be manufactured by existing coating equipment is $70\Omega/\square$. However, with development of a narrow-bezel technology and a full-screen technology, the widths of signal lines which are connected to the touch electrode are required to be smaller and smaller, for example, the required widths of the signal lines at present are 20 μm or below, but the resistance value of the signal lines is increased along with narrowing of the signal lines, then the sheet resistance of the touch electrode (ITO) is required to be reduced to meet the driving requirement of a driving chip (IC), and the sheet resistance of ITO is required to be $30\text{-}40\Omega/\square$ at present. The sheet resistance is the ratio of resistivity to thickness, therefore, the lower sheet resistance value only can be achieved by increasing the thickness of ITO, ITO is thick comparatively, therefore, pressure stress is large, moreover the flexible substrate is relatively thin, and the flexible substrate on which the touch electrode layer is manufactured quite easily curls when torn off from the base substrate.

According to the manufacturing method of the flexible touch screen provided by the embodiment of the present disclosure, before the flexible substrate is attached to the base substrate, the first protecting layer is attached to the surface of the flexible substrate, the second protecting layer is attached to the flexible substrate after the touch electrode layer is manufactured, therefore, the flexible substrate is unlikely to curl when separated from the base substrate, and therefore, the comparatively thick touch electrode layer can be manufactured to meet the requirement for low sheet resistance. Although the resistance value may be increased when the signal lines are narrowed, the resistance value of the touch electrode accounts for about 70%-80% of the total resistance, therefore, RC can be reduced by reducing the sheet resistance of the touch electrode layer, wherein R represents channel resistance, C represents capacitance, the charging time of a display device (such as a mobile phone) is shortened, and touch sensitivity is improved.

In the embodiment of the present disclosure, by manufacturing the touch electrode layer on the flexible substrate, the flexible touch screen can be obtained. The flexible substrate is optionally made from a cyclo olefin polymer (COP), moreover, other materials can also be adopted, as long as the materials are flexible materials, for example, polyimide (PI), polyethersulfone resin (PES) and polyethylene terephthalate (PET) materials can also be adopted, and the material of the flexible substrate is not limited here.

Because the flexible substrate is comparatively thin and soft, the flexible substrate is generally attached to the base substrate at first, then various film layers in the touch electrode layer are then manufactured on the surface of the flexible substrate, optionally the base substrate is a glass substrate, moreover, the base substrate can also be another hard substrate, and the material of the base substrate is not limited here. The flexible substrate is comparatively soft and cannot be easily attached to the base substrate directly, therefore, in the embodiment of the present disclosure, the first protecting layer is attached to the surface of the flexible substrate at first and can have effect of supporting the flexible substrate, the flexible substrate can be flatly attached to the base substrate, the circumstance that excessive bubbles are generated in a process of attaching the flexible substrate to the base substrate is prevented to avoid affecting the smoothness of the touch electrode layer which is formed on the flexible substrate later, then the first protecting layer is removed, and the structure of the flexible touch screen cannot be affected.

Then the various film layers in the touch electrode layer are successively formed on the flexible substrate, in order to prevent the flexible substrate from curling when the flexible substrate is separated from the base substrate, the second protecting layer is attached to the touch electrode layer, is similar to the first protecting layer, and can also have a supporting effect, the flexible substrate is unlikely to curl when separated from the base substrate, then the second protecting layer is removed, and thus, the structure of the flexible touch screen cannot be affected.

In some embodiments of the present disclosure, in the manufacturing method, the difference between the coefficient of thermal expansion of the first protecting layer and the coefficient of thermal expansion of the flexible substrate is smaller than 0.05%.

The difference between the coefficient of thermal expansion of the second protecting layer and the coefficient of thermal expansion of the flexible substrate is smaller than 0.05%.

The flexible substrate has certain film shrinking force, namely, when the temperature changes, the flexible substrate stretches and retracts to a certain degree, for example, the film shrinking value of the flexible substrate manufactured from a COP material is 0.4+/−0.05%. When the difference between the coefficient of thermal expansion of the first protecting layer and the coefficient of thermal expansion of the flexible substrate is large, the flexible substrate cannot be quite smooth when the first protecting layer is attached to the surface of the flexible substrate, therefore, bubbles are easily generated when the flexible substrate is attached to the base substrate, the smoothness of the flexible substrate is affected, and the various film layers of the touch electrode layer formed later also have uneven surfaces. Similarly, when the difference between the coefficient of thermal expansion of the second protecting layer and the coefficient of thermal expansion of the flexible substrate is large, the surface of the touch electrode layer is uneven easily when the second protecting layer is attached to the touch electrode layer, and the smoothness of the flexible substrate can even be affected. Therefore, the first protecting layer and the second protecting layer are made from materials of which the coefficient of thermal expansion is similar to the coefficient of thermal expansion of the flexible substrate to ensure the smoothness of the various film layers on the flexible substrate, in the embodiment of the present disclosure, the difference between the coefficient of thermal expansion of the first protecting layer and the coefficient of thermal expansion of the flexible substrate and the difference between the coefficient of thermal expansion of the second protecting layer and the coefficient of thermal expansion of the flexible substrate are smaller than 0.05% optionally, moreover, the first protecting layer and the second protecting layer can also be made from the materials which are the same as the material of the flexible substrate so as to be matched with the coefficient of thermal expansion of the flexible substrate, and thus, the smoothness of the flexible substrate is ensured.

In some embodiments of the disclosure, in the manufacturing method, the material of the first protecting layer can be phenolic resin (PF), polyethylene terephthalate (PET) or cyclo olefin polymer (COP).

The material of the second protecting layer is phenolic resin (PF), polyethylene terephthalate (PET) or cyclo olefin polymer (COP).

During specific implementation, optionally the material of the first protecting layer and the material of the second protecting layer are the same. Moreover, the material of the first protecting layer and the material of the second protecting layer can be different, and are not limited here. The PF, PET or COP are only optional materials provided by the embodiment of the present disclosure, and during specific implementation, the material of the first protecting layer and the material of the second protecting layer can also be other flexible materials, and are not limited here.

In practical application, the flexible substrate is made from a COP material generally, the material of the first protecting layer and the material of the second protecting layer can be the same as the material of the flexible substrate so as to be matched with the coefficient of thermal expansion of the flexible substrate, and therefore, the contractility of the first protecting layer (or the second protecting layer) can be consistent to that of the flexible substrate. In addition, in order to reduce costs, a PET material or a PF material which is low in price can also be adopted, and the material of the first protecting layer and the material of the second protecting layer are not limited here.

In some embodiments, in the manufacturing method, the step S102 may include the followings.

Figure 3A:
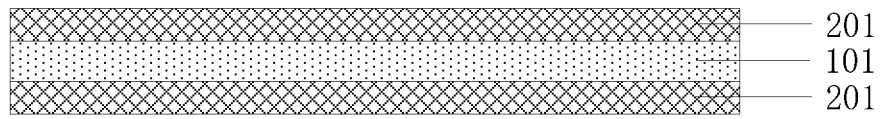
FIG. 3A to FIG. 3M are schematic diagrams of various structures corresponding to the manufacturing method according to the embodiment of the present disclosure.
Figure 3B:
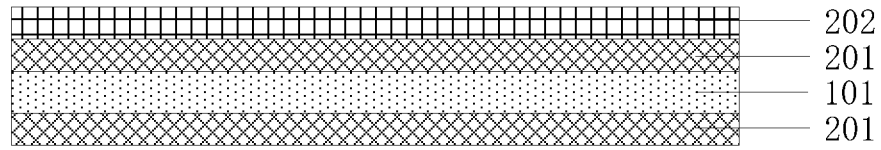
Figure 3C:
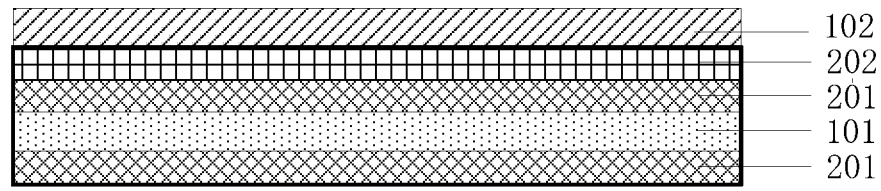
Figure 3D:

Referring to FIG. 3D, a temperature-controlled bonding layer 203 is formed on the base substrate 103.

The flexible substrate is attached to the base substrate through the temperature-controlled bonding layer.

The flexible substrate is comparatively thin, the surface of the flexible substrate is comparatively smooth, therefore bubbles are easily generated between the flexible substrate and the base substrate when the flexible substrate is directly attached to the base substrate, the temperature-controlled bonding layer is formed on the base substrate, viscosity between the flexible substrate and the base substrate can be improved, and the bubbles are avoided. Moreover, the viscosity of the temperature-controlled bonding layer is related to the temperature, for example, the viscosity of temperature-controlled bonding layers made from some materials is gradually increased along with increasing of the temperature, thus, the flexible substrate can be attached to the base substrate well by the relation between the temperature and the viscosity, for example, the temperature-controlled bonding layer is made from the material of which the viscosity is increased along with increasing of the temperature, the flexible substrate can be flatly laid on the base substrate when the temperature is low, then the base substrate is heated to increase the viscosity of the temperature-controlled bonding layer, and therefore, the flexible substrate adheres to the base substrate. Because the viscosity of the temperature-controlled bonding layer can be controlled through the temperature, before the flexible substrate adheres to the base substrate, it can have enough time to flatly lay the flexible substrate onto the base substrate, and the smoothness of the flexible substrate can be good.

In some embodiments of the present disclosure, the temperature-controlled bonding layer can be made from an optically clear adhesive (OCA) material, the viscosity of the OCA material is increased along with increasing of the temperature. Moreover, the temperature-controlled bonding layer can also be made from other materials, and the material of the temperature-controlled bonding layer is not limited here.

In some embodiments of the disclosure, in the manufacturing method above, the step S107 can include: after the flexible substrate on which the touch electrode layer is formed is cut, the second protecting layer is removed.

The flexible substrate on which the touch electrode layer is formed is still quite thin, when the flexible substrate is cut after the second protecting layer is removed, the flexible substrate curls easily due to stress generated in a cutting process, or the structure of the touch electrode layer on the surface is easy to scratch, and therefore, the second protecting layer only can be removed after the flexible touch screen is cut into a plurality of single flexible touch screen bodies. In addition, before the second protecting layer is removed, some module processes can further be carried out possibly, for example, the signal lines are bound, and the second protecting layer can serve as a growing film of a binding process.

In some embodiments of the disclosure, in the manufacturing method, before the step S101, the following step can be carried out.

As shown in FIG. 3A, a hardened layer 201 is formed on each of two surfaces of the flexible substrate 101.

Because the flexible substrate is crisp, the flexibility of the flexible substrate can be improved by the hardened layers which are separately formed on the two surfaces of the flexible substrate, and then the flexible substrate is unlikely to break off. The surface of the flexible substrate is comparatively smooth, the flexible substrate is directly attached to the base substrate, the flexible substrate easily slips relative to the base substrate, the bubbles are easily generated in an attaching process, the hardened layers can further be used as isolating layers, the viscosity between the flexible substrate and the base substrate is improved, and therefore, the flexible substrate is prevented from slipping relative to the base substrate.

In some embodiments of the disclosure, in the manufacturing method, the step S101 can the following steps.

As shown in FIG. 3B, an index-matching layer 202 is formed on any one surface of the flexible substrate 101.

As shown in FIG. 3C, the first protecting layer 102 is attached to the index-matching layer 202.

Because a certain difference exists between the transmittance of a region with the pattern of the touch electrode and the transmittance of a region without the touch electrode in the touch electrode layer, the index-matching layer is arranged on the surface of the flexible substrate and has an index-matched effect, people cannot recognize the difference between the transmittances with eyes, and the display effect can be improved.

Figure 3E:
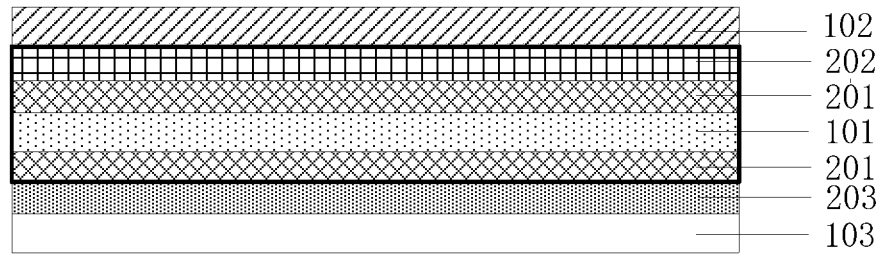
Figure 3F:
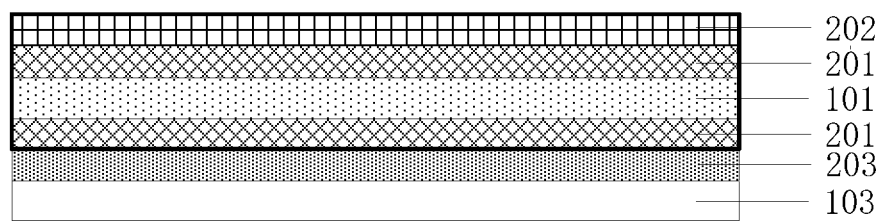

In a manufacturing process, the flexible substrate, the hardened layers disposed on the two surfaces of the flexible substrate and the index-matching layer can be taken as a whole to be subjected to a follow-up process. As shown in FIG. 3C, in order to clearly illustrate the flexible substrate, the hardened layers and the index-matching layer as a whole, the flexible substrate 101, the hardened layers 201 and the index-matching layer 202 are enclosed with a black thick line box in the figure. During specific implementation, the flexible substrate which is manufactured in advance and is provided with the hardened layers and the index-matching layer can be attached to the first protecting layer to obtain a structure as shown in FIG. 3C. Then the structure as shown in FIG. 3C is attached to a structure as shown in FIG. 3D, wherein the temperature-controlled bonding layer is arranged on the surface of the base substrate 103 as shown in FIG. 3D, moreover, the hardened layers 201 are arranged on the surfaces of the flexible substrate 101 as shown in FIG. 3C to ensure that the flexible substrate 101 can be flatly attached to the surface of the base substrate 101 so as to obtain a structure as shown in FIG. 3E, then the first protecting layer is removed to obtain a structure as shown in FIG. 3F, and the first protecting layer is prevented from affecting the structure of the flexible touch screen.

In some embodiments of the disclosure, in the manufacturing method, the step S104 can specifically include the following steps.

Figure 3G:
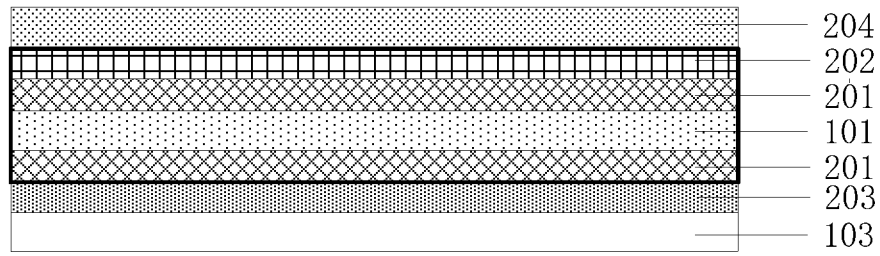

Referring to FIG. 3G, a plurality of first touch electrodes and a plurality of second touch electrodes are formed on the side of the flexible substrate 103 away from the base substrate 103; wherein the first touch electrodes and the second touch electrodes can be made of the same material by the same process, as shown in a first transparent conductive layer 204 in the figure. Specifically, the first touch electrodes and the second touch electrodes are intersected with each other, each first touch electrode is of a strip-shaped structure, and each second touch electrode includes a plurality of sub-electrodes.

Figure 3H:
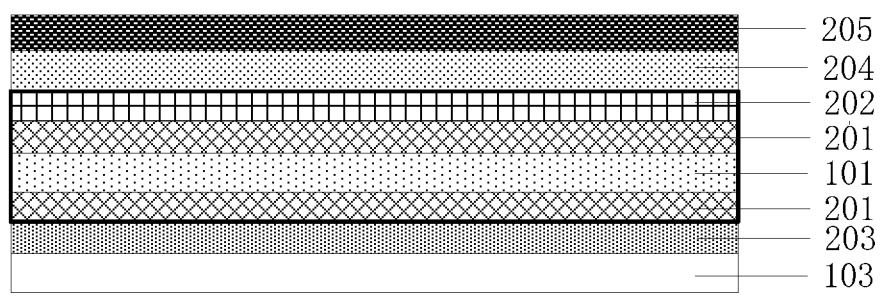

A plurality of signal lines are formed. The signal lines are connected with the first touch electrodes or the second touch electrodes; and the signal lines are generally disposed in a bezel region, therefore, the signal lines can be made of a metal material, and as shown in FIG. 3H, a metal layer 205 located on the first transparent conductive layer 204 shows a layer where the multiple signal lines are located.

Figure 3I:
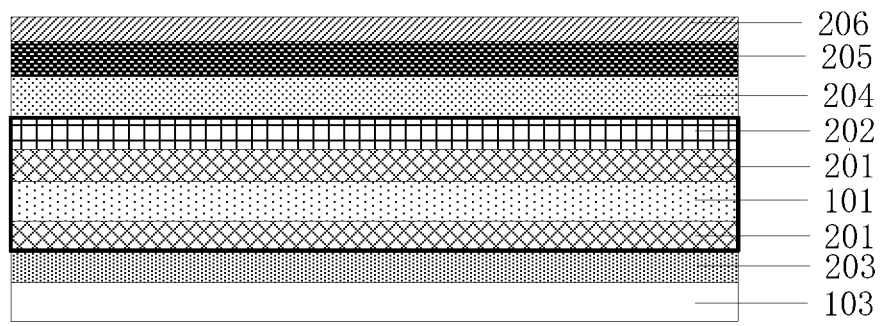

As shown in FIG. 3I, an insulating layer 206 is formed on the layer (namely the metal layer 205) where the signal lines are located.

Figure 3J:
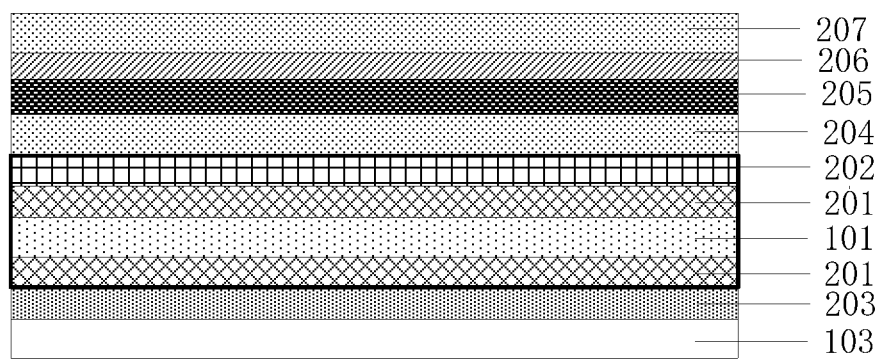

As shown in FIG. 3J, a plurality of bridging lines are formed on the insulating layer 206. The bridging lines are located in the layer where the second transparent conductive layer 207 is located. The bridging lines are configured to connect the various sub-electrodes in the second touch electrodes, and therefore, each second touch electrode and the corresponding first touch electrode form a mutual capacitor to detect touch. In other words, the touch electrode layer includes the first transparent conductive layer, the metal layer, the insulating layer and the second transparent conductive layer.

In the embodiment of the present disclosure, the structures of the mutual capacitors are taken as an example to illustrate the manufacturing flow of the touch electrode layer. In some embodiments of the disclosure, the touch electrode layer can also be of another structure, for example, a self-capacitor mode or a mutual capacitor mode of another structure can be adopted, and the structure and manufacturing flow of the touch electrode layer are not limited here.

Figure 3K:
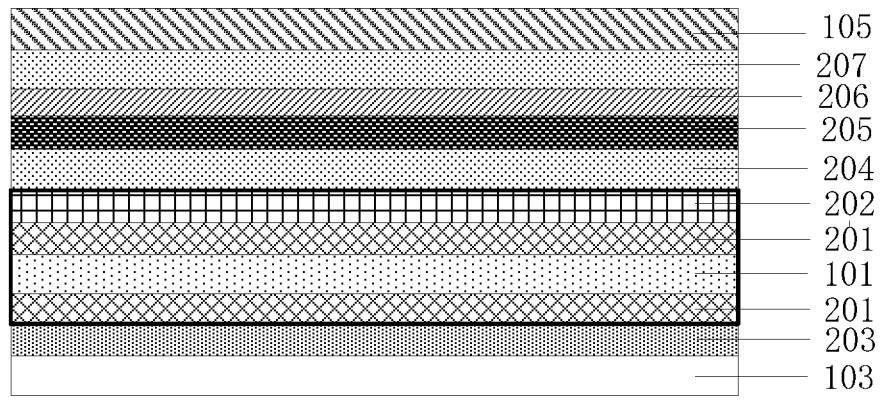
Figure 3L:
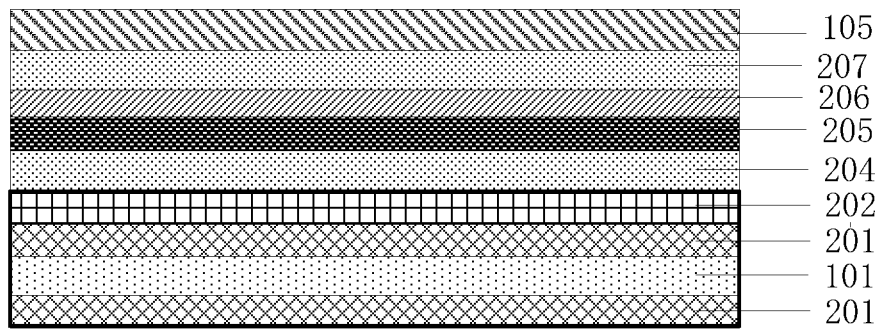
Figure 3M:
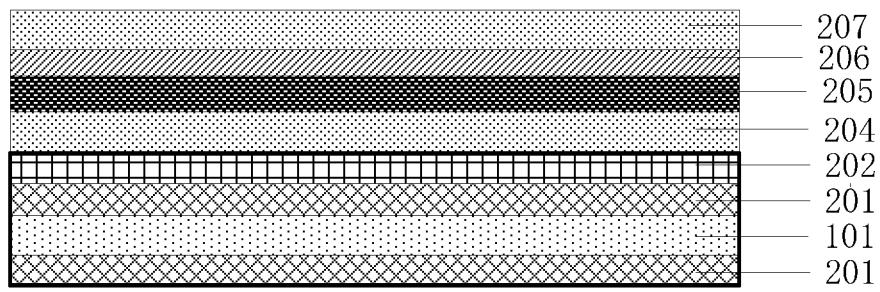

As shown in FIG. 3K, the second protecting layer 105 is attached to the second transparent conductive layer 207, so that the flexible touch screen can be smoothly separated from the base substrate to obtain a structure as shown in FIG. 3L. Finally, after the structure as shown in FIG. 3L is divided into a plurality of single flexible touch screens, the second protecting layer is removed to obtain a structure as shown in FIG. 3M.

In another aspect, on the basis of the same concept, the embodiment of the present disclosure provides a flexible touch screen, and the flexible touch screen is manufactured by the manufacturing method of the flexible touch screen. Since the principle of solving problems of the flexible touch screen is similar to the principle of solving problems of the manufacturing method, implementation of the flexible touch screen can be referred to implementation of the manufacturing method, and repeated description is omitted here.

In another aspect, on the basis of the same concept, the embodiment of the present disclosure provides a display device, and the display device includes the flexible touch screen, and can be applied to any of products or components with display functions such as a mobile phone, a tablet computer, a television set, a display, a notebook computer, a digital photo frame and a navigator. Since the principle of solving problems of the display device is similar to the principle of solving problems of the flexible touch screen, implementation of the display device can be referred to implementation of the flexible touch screen, and repeated description is omitted here.

In the flexible touch screen, the manufacturing method thereof and the display device in accordance with the embodiment of the present disclosure, before the flexible substrate is attached to the base substrate, the first protecting layer is attached to the surface of the flexible substrate, the first protecting layer has a supporting effect, the flexible substrate can be flatly attached to the base substrate, after the flexible substrate is attached to the base substrate, the first protecting layer is removed, the structure of the flexible touch screen is not affected. Moreover the second protecting layer is attached to the flexible substrate after the touch electrode layer is manufactured, therefore, the flexible substrate cannot curl when separated from the base substrate, and the yield of products is improved.

Obviously, it will be apparent to those skilled in the art that various modifications and variations can be made to the present disclosure without departing from the spirit and scope of the present disclosure. Thus, if these modifications and variations of the present disclosure belong to the scopes of claims of the present disclosure and their equivalent techniques, then the present disclosure is also intended to include these modifications and variations.

The invention claimed is:

1. A manufacturing method of a flexible touch screen, comprising:

attaching a first protecting layer to a surface of a flexible substrate;

attaching a surface of the flexible substrate away from the first protecting layer to a base substrate;

removing the first protecting layer;

forming a touch electrode layer on a side of the flexible substrate away from the base substrate;

attaching a second protecting layer to a surface of the touch electrode layer;

separating the flexible substrate from the base substrate; and removing the second protecting layer.

2. The manufacturing method according to claim 1, wherein a difference between a coefficient of thermal expansion of the first protecting layer and a coefficient of thermal expansion of the flexible substrate is smaller than 0.05%; and a difference between a coefficient of thermal expansion of the second protecting layer and the coefficient of thermal expansion of the flexible substrate is smaller than 0.05%.

3. The manufacturing method according to claim 1, wherein a material of the first protecting layer is phenolic resin, polyethylene terephthalate or cyclo olefin polymer; and a material of the second protecting layer is phenolic resin, polyethylene terephthalate or cyclo olefin polymer.

4. The manufacturing method according to claim 1, wherein attaching the surface of the flexible substrate away from the first protecting layer to the base substrate comprises:

forming a temperature-controlled bonding layer on the base substrate; and attaching the flexible substrate to the base substrate through the temperature-controlled bonding layer.

5. The manufacturing method according to claim 1, wherein forming the touch electrode layer on the side of the flexible substrate away from the base substrate comprises:

forming a plurality of first touch electrodes and a plurality of second touch electrodes on the side of the flexible substrate away from the base substrate, wherein the first touch electrodes and the second touch electrodes are intersected with each other, each of the first touch electrodes is of a strip-shaped structure, and each of the second touch electrodes comprises a plurality of sub-electrodes;

forming a plurality of signal lines, wherein the signal lines are connected with the first touch electrodes or the second touch electrodes;

forming an insulating layer on a layer where the signal lines are located; and forming a plurality of bridging lines on the insulating layer, wherein the bridging lines are configured to connect the sub-electrodes in the second touch electrodes.

6. The manufacturing method according to claim 3, wherein the material of the first protecting layer is the same as the material of the second protecting layer.

7. The manufacturing method according to claim 6, wherein the material of the first protecting layer and the material of the second protecting layer are the same as a material of the flexible substrate.

8. The manufacturing method according to claim 4, wherein a material of the temperature-controlled bonding layer is an optically clear adhesive material.

* * * * *